(12) United States Patent
Asanuma

(10) Patent No.: US 6,451,511 B1
(45) Date of Patent: *Sep. 17, 2002

(54) METHOD FOR FORMING-PHOTORESIST MASK

(75) Inventor: Yuji Asanuma, Tokyo (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/364,035

(22) Filed: Jul. 30, 1999

(30) Foreign Application Priority Data

Aug. 6, 1998 (JP) ............................................. 10-233470

(51) Int. Cl.$^7$ ................................................. G03F 7/00
(52) U.S. Cl. ..................... 430/312; 430/322; 430/325; 430/328; 430/330; 430/394; 430/396
(58) Field of Search ................................ 430/312, 322, 430/325, 328, 330, 394, 396

(56) References Cited

U.S. PATENT DOCUMENTS 4,814,258 A * 3/1989 Tam .............................. 43/315
4,859,573 A * 8/1989 Maheras et al. ............. 430/326
4,988,609 A * 1/1991 Hashimoto et al. ......... 430/326
5,468,595 A * 11/1995 Livesay ....................... 430/296
5,658,469 A * 8/1997 Jennison ........................ 216/22
5,725,997 A * 3/1998 Kamijima .................... 430/325
5,885,749 A * 3/1999 Huggins et al. ............. 430/312
6,042,975 A * 3/2000 Burm et al. .................. 430/22
6,303,392 B1 * 10/2001 Matsukuma ................... 438/3

FOREIGN PATENT DOCUMENTS

JP  62-105423 A  *  5/1987
JP  62-141548 A  *  6/1987
JP  4-46346         2/1992

\* cited by examiner

Primary Examiner—Mark F. Huff
Assistant Examiner—Nicole Barreca
(74) Attorney, Agent, or Firm—Oblon, Spivak, McClelland, Maier & Neustadt, P.C.

(57) ABSTRACT

Multiple exposure of a photoresist layer having an exposure depth depending upon the amount of exposure energy applied are executed at different respective exposure energy amounts through a plurality of respective photomasks with different respective opening patterns. The photoresist layer is then processed for image reversal.

3 Claims, 2 Drawing Sheets

METHOD FOR FORMING-PHOTORESIST MASK

FIELD OF THE INVENTION

The present invention relates to a method for forming a photoresist mask utilized in various fabrication processes of semiconductor devices, thin-film devices such as thin-film magnetic heads, thick-film devices and other devices.

DESCRIPTION OF THE RELATED ART

In photolithographic processes or sputtering processes executed during fabrication of such devices, undercut photoresist masks (photoresist masks with undercuts in their lower portions) may be sometimes used so as to obtain patterned layers with desired tapered sidewall faces without burr.

There are two known approaches for forming the undercut photoresist mask. One is an image reversal photoresist process and the other is a double photoresist layers process.

The former process, which is described in for example Japanese patent unexamined publication No.4-46346 and U.S. Pat. No. 5,658,469, uses a novolak type positive tone photoresist capable of image reversal, and renders the positive photoresist to negative by post exposure bake and flood expose processes.

FIGS. 1a–1e are sectional views illustrating processes of forming the photoresist mask by using this image reversal photoresist.

First, as shown in FIG. 1a, a photoresist layer 11 is coated on a substrate 10. Then, as shown in FIG. 1b, a pattern of a photoresist mask to be obtained is exposed by a relatively little amount of exposure via a photomask 12. Reference numeral 13 in the figure represents the exposed pattern or area of the photoresist layer 11. Then, as shown in FIG. 1c, the post exposure bake process is performed to convert the photoresist within the exposed region 13 into insoluble. Thereafter, as shown in FIG. 1d, the flood expose process is performed to expose entire region of the photoresist layer 11. Then, by developing, a part of a lower portion 14 of the photoresist layer 11 in the exposed region 13 is removed to provide an undercut photoresist sidewall as shown in FIG. 1e.

However, according to this approach, since height and width of the undercut profile may vary depending upon a penetrating degree of a developer or solvent into the photoresist material under the area 13, it is very difficult to always keep a desired shape of the undercut profile. Thus, no volume production of the devices can be expected. Furthermore, this approach cannot be applied to the lift-off process of a thick-film layer because of limitation of the height of the fabricated undercut profile.

The latter process, namely the double photoresist layers process, is well known. According to this process, first, a lower photoresist layer is coated on a substrate, and then baked. Next, an upper photoresist layer made of material which will never mix with that of the lower photoresist layer is coated on the lower photoresist layer. Then, a photoresist pattern is transferred from a photomask to these two layers and thereafter development is performed. Since etch rates of these two layers with respect to the developer differ with each other, namely the lower layer is more soluble than the upper layer, a desired undercut profile of the photoresist mask can be obtained.

This double photoresist layers process needs however two coating steps for the lower and upper photoresist layers and a baking step between the coating steps causing the number of processing steps to increase and also the fabricating process to complicate. Furthermore, since removal of a part of the lower photoresist layer for generating an undercut is difficult, the removing step may be sometimes necessary to execute twice causing the number of processing steps to further increase. In addition, since the shape of the undercut is controlled based upon the differing etch rates between the lower and upper photoresist layers, simultaneous control of the height and width of the undercut is very difficult. As well as the aforementioned approach, this approach cannot be adopted to the lift-off process of a thick-film layer because of limitation of the height of the fabricated undercut profile.

SUMMARY OF THE INVENTION

It is therefore an object of the present invention to provide a method for forming a photoresist mask, whereby various undercut profiles can be easily produced in accordance with requirements from fabricating process of devices.

According to the present invention, a method for forming a photoresist mask includes a step of forming a photoresist layer, exposure depth of the layer being controllable depending upon exposure amount, and a step of performing multiple exposes of the formed photoresist layer at different exposure amounts via a plurality of photomasks with different opening patterns, respectively.

Also, according to the present invention, a method for forming a photoresist mask with a lower portion and an upper portion which is wider than the lower portion, includes a step of forming a photoresist layer, exposure depth of the layer being controllable depending upon exposure amount, and a step of performing multiple exposes of the formed photoresist layer at different exposure amounts via a first photomask with an opening pattern corresponding to a pattern of the lower portion and via a second photomask with an opening pattern corresponding to a pattern of the upper portion, respectively.

Since multiple exposes of a photoresist layer of which exposure depth is controllable depending upon exposure amount are executed at different exposure amounts via a plurality of photomasks with different opening patterns, respectively, the exposure depth corresponding to each photomask pattern can be appropriately controlled. Thus, a three-dimensionally shaped photoresist mask with a re-entrant profile such as an arched profile or an undercut profile can be precisely and easily formed.

It is preferred that the exposure amount at the expose using the first photomask is larger than that at the expose using the second photomask.

It is also preferred that the forming step is a step of forming a photoresist layer made of a positive tone photoresist material capable of image reversal, and that the performing step is a step of performing multiple exposes of the formed photoresist layer before image reversal processing.

More preferably, the photoresist material is a novolak type positive tone photoresist material.

It is preferred that the method further includes a step of executing post exposure bake processing for image reversal of the photoresist layer, a step of executing flood expose processing of the photoresist layer, and then a step of developing the photoresist layer.

Further objects and advantages of the present invention will be apparent from the following description of the preferred embodiments of the invention as illustrated in the accompanying drawings.

DESCRIPTION OF THE PREFERRED EMBODIMENTS

Figure 1A:
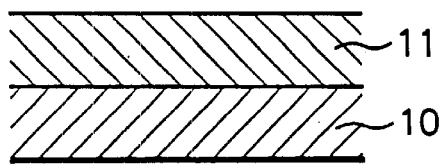
FIGS. 1a to 1e, which were already described as a conventional art, show sectional views illustrating processes of forming a photoresist mask by using an image inversion photoresist.
Figure 1B:
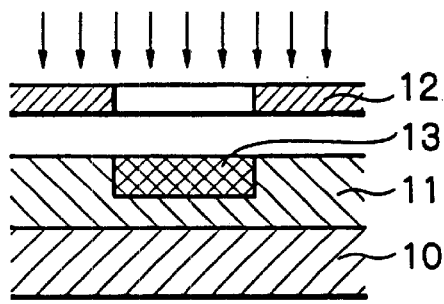
Figure 1C:
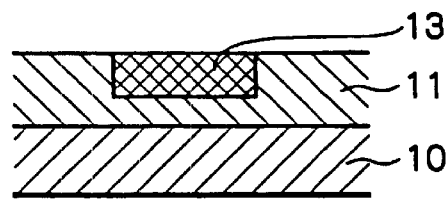
Figure 1D:
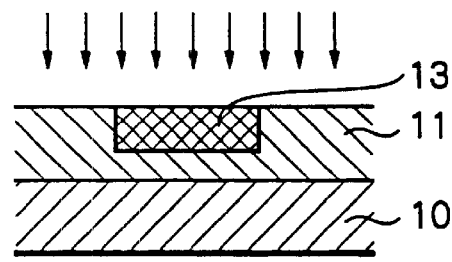
Figure 1E:
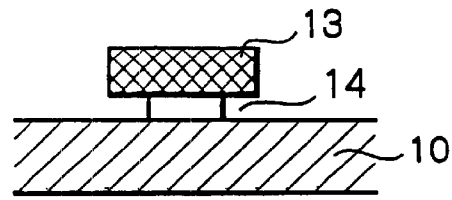
Figure 2A:
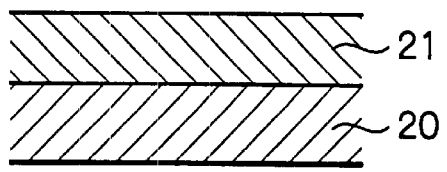
FIGS. 2a to 2f show sectional views schematically illustrating processes of forming a photoresist mask as a preferred embodiment according to the present invention.

First, as shown in FIG. 2a, a photoresist layer 21 is coated on a substrate 20. In case of fabricating a thin-film device such as a thin-film magnetic head, the substrate 20 may be made of AlTiC for example, and the photoresist layer 21 may be made of photoresist material capable of image reversal processing. According to the invention, the exposure depth of the photoresist material utilized for the photoresist layer 21 has to be controlled depending upon the amount of exposure. Preferably, the photoresist layer 21 is made of a novolak type positive tone photoresist material such as an image reversal capable positive photoresist 5214 of Clariant Co., Ltd. for example.

The photoresist material according to the present invention is not limited to the above-mentioned image reversal positive tone photoresist material, but a negative tone photoresist material may be utilized if its exposure depth can be controlled depending upon the amount of exposure and it has the same effective resolution.

Figure 2B:
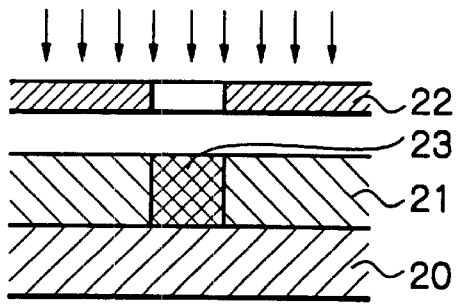

Then, as shown in FIG. 2b, the photoresist layer 21 is exposed via a first photomask 22 that has an opening pattern corresponding to a pattern of a base or lower portion with a re-entrant such as an undercut, of the photoresist mask profile to be formed. This exposure of the base portion is executed by a relatively large amount of exposure so that the exposed region 23 reaches the bottom of the photoresist layer 21.

Figure 2C:
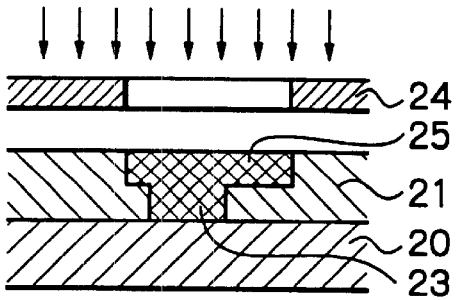

Then, as shown in FIG. 2c, the photoresist layer 21 is exposed via a second photomask 24 that has an opening pattern corresponding to a pattern of a head or upper portion of the photoresist mask profile to be formed. The pattern of the head portion is wider than that of the base portion. This exposure of the head portion is executed by a relatively little amount of exposure so that the exposed region 25 does not reach the bottom of the photoresist layer 21 but has a predetermined depth from the top surface of the layer 21. This depth of the exposed region 25 defines the height of the undercut. It is apparent that the width of the undercut is defined by the opening pattern of the first photomask 22.

Figure 2D:
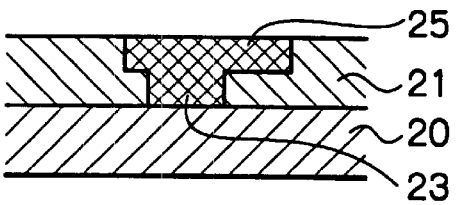
Figure 2E:
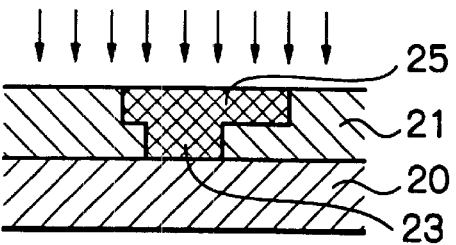
Figure 2F:
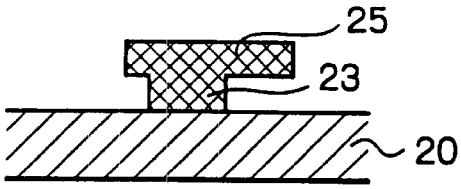

Thereafter, image reversal is achieved by executing the post exposure bake process as shown FIG. 2d. Then, flood expose is executed as shown FIG. 2e, and development is executed to dissolve and remove unnecessary part of the photoresist layer 21 as shown in FIG. 2f. As a result, the exposed region 23 remains as the base portion with the undercut, of the photoresist mask, and the exposed region 25 remains as the head portion, located above the undercut, of the photoresist mask.

According to the present invention, as will be understood, the height of the undercut profile can be optionally controlled by adjusting the exposure amount at the exposing step of the head portion of the photoresist layer 21, and the width of the undercut profile can be optionally determined by designing the photomask pattern at the exposing step of the base portion of the photoresist layer 21. Therefore, both height and width of the undercut profile of the photoresist mask can be freely controlled. The shape of the head portion of the photoresist mask can be of course freely determined by designing the photomask pattern at the exposing step of the head portion of the photoresist layer 21. Therefore, according to the present invention, a highly accurate photoresist mask with an undercut profile, which can be applied to any lift-off process of not only a thin-film layer but also a thick-film layer can be provided. In addition, various undercut profiles can be easily realized depending upon the requirements from fabricating process of devices. In other words, a high-precision photoresist mask can be easily provided for a thin-film device and also a lower-precision photoresist mask can be easily provided for a thick-film device.

Actually, a photoresist layer made of the aforementioned image reversal capable positive photoresist 5214 was coated with about 3 $\mu$m thickness on a substrate, the coated photoresist was exposed via the first photomask 22 to make the exposed region 23 corresponding to the base portion with the undercut at the exposure amount of about 300 mj/cm$^2$, and then exposed via the second photomask 24 to make the exposed region 25 corresponding to the head portion at the exposure amount of about 50 mj/$^2$. As a result, an undercut profile with the height of about 2 $\mu$m was obtained. It should be noted that such tall height of the undercut profile would never be obtained according to the conventional processes. Also, it was actually confirmed that this height of the undercut profile can be optionally controlled by adjusting the exposure amount at the exposing step of the head portion of the photoresist layer using the second photomask 24.

In the aforementioned embodiment, first the exposing step of the base portion of the photoresist layer and then the exposing step of the head portion are executed, respectively. However, the method according to the present invention can be performed in reverse order.

Also, in the aforementioned embodiment, two exposing steps using different photomasks are executed to form the base portion and the head portion of the photoresist layer. However, the forming method according to the present invention can be performed by three or more exposing steps using different photomasks to form a plurality of undercut profiles with different heights and/or different widths in the same photoresist layer.

Furthermore, in the aforementioned embodiment, a simple undercut profile is formed in the base portion of the photoresist layer. However, the forming method of the present invention can provide a three-dimensionally shaped photoresist mask with a re-entrant in a part of its base portion, for example, an arched profile photoresist mask with a head portion arched between two base portions of the photoresist layer.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for forming a photoresist mask comprising the steps of:

forming a single-layered photoresist layer made of a positive novolak photoresist material capable of image reversal and having an exposure depth depending upon an amount of exposure;

performing a first exposure of said photoresist layer at a first amount of exposure through a first photomask with a first opening pattern corresponding to a lower portion pattern and a second exposure at a second amount of exposure through a second photomask with a second opening pattern corresponding to an upper portion pattern that is wider than said lower portion pattern; and performing image reversal processing of the photoresist layer after completing the first exposure and the second exposure to obtain the photoresist mask with said lower portion pattern and said upper portion pattern.

2. The amount as claimed in claim 1, wherein said exposure amount at the first exposure using said first photomask is larger than that at the second exposure using said second photomask.

3. The method as claimed in claim 1, wherein said step of performing image reversal processing includes executing post exposure bake processing of the photoresist layer and executing flood exposure processing of the photoresist layer after said bake processing.

\* \* \* \* \*

UNITED STATES PATENT AND TRADEMARK OFFICE
CERTIFICATE OF CORRECTION

PATENT NO.    : 6,451,511 B1
DATED         : September 17, 2002
INVENTOR(S)   : Asanuma It is certified that error appears in the above-identified patent and that said Letters Patent is hereby corrected as shown below:

<u>Title page, Item [54] and Column 1, lines 1&2,</u>
The Title should read:

-- [54]  METHOD FOR FORMING PHOTORESIST MASK --

Signed and Sealed this

Twenty-eighth Day of January, 2003

JAMES E. ROGAN
*Director of the United States Patent and Trademark Office*